(12) United States Patent
Tanabe

(10) Patent No.: US 8,389,345 B2
(45) Date of Patent: Mar. 5, 2013

(54) THIN FILM TRANSISTOR AND MANUFACTURING METHOD OF THE SAME

(75) Inventor: Hiroshi Tanabe, Kanagawa (JP)

(73) Assignee: NEC LCD Technologies, Ltd., Kanagawa (JP)

(*) Notice: Subject to any disclaimer, the term of this patent is extended or adjusted under 35 U.S.C. 154(b) by 48 days.

(21) Appl. No.: 12/954,794

(22) Filed: Nov. 26, 2010

(65) Prior Publication Data

US 2011/0068343 A1 Mar. 24, 2011

Related U.S. Application Data

(63) Continuation of application No. 12/169,854, filed on Jul. 9, 2008, now Pat. No. 7,932,137.

(30) Foreign Application Priority Data

Jul. 9, 2007 (JP) ................................. 2007-179822

(51) Int. Cl.
*H01L 21/205* (2006.01)
(52) U.S. Cl. ................................. 438/151; 257/E21.101
(58) Field of Classification Search .................. 257/288, 257/347, 349, E21.101, E29.282; 438/151, 438/164, 165
See application file for complete search history.

(56) References Cited

U.S. PATENT DOCUMENTS

| 5,605,847 | A * | 2/1997 | Zhang | 438/164 |
| 6,875,674 | B2 * | 4/2005 | Asami et al. | 438/482 |
| 7,202,115 | B2 * | 4/2007 | Hirano et al. | 438/149 |
| 2005/0156239 | A1 * | 7/2005 | Seko et al. | 257/347 |
| 2008/0296580 | A1 | 12/2008 | Mori et al. | |

FOREIGN PATENT DOCUMENTS

| JP | 08-204208 | 8/1996 |
| JP | 09-213964 | 8/1997 |
| JP | 10-048663 | 2/1998 |
| JP | 11-126905 | 5/1999 |
| JP | 11-258636 | 9/1999 |
| JP | 2004-064060 | 2/2004 |
| JP | 2004-247434 | 9/2004 |
| JP | 2004-302475 | 10/2004 |

OTHER PUBLICATIONS

Japanese Official Action—2007-179822—Oct. 23, 2012.

* cited by examiner

*Primary Examiner* — Julio J Maldonado
*Assistant Examiner* — Daniel Shook
(74) *Attorney, Agent, or Firm* — Young & Thompson

(57) ABSTRACT

To achieve TFT having a high light-resistance characteristic with a suppressed light leak current at low cost by simplifying the manufacturing processes. The TFT basically includes: a light-shielding film formed on a glass substrate that serves as an insulating substrate; an insulating film formed on the light-shielding film; a semiconductor film formed on the insulating film; and a gate insulating film formed on the semiconductor film. Each layer of a laminate that is configured with three layers of the light-shielding film, the insulating film, and the semiconductor film is patterned simultaneously. Further, each layer of the laminate is configured with silicon or a material containing silicon.

9 Claims, 9 Drawing Sheets

FIG. 4A a-Si

| WAVELENGTH [nm] | REFRACTIVE INDEX | ATTENUATION COEFFICIENT | ABSORPTION COEFFICIENT | TRANSMITTANCE WITH EACH FILM THICKNESS | | | | |
|---|---|---|---|---|---|---|---|---|
| | | | | 10nm | 20nm | 30nm | 40nm | 50nm |
| 400.4 | 4.94 | 2.13 | 0.067 | 0.512 | 0.262 | 0.134 | 0.069 | 0.035 |
| 449.7 | 5.05 | 1.42 | 0.040 | 0.673 | 0.453 | 0.305 | 0.206 | 0.138 |
| 500.6 | 4.94 | 0.88 | 0.022 | 0.801 | 0.642 | 0.514 | 0.412 | 0.330 |
| 549.9 | 4.76 | 0.55 | 0.013 | 0.882 | 0.778 | 0.686 | 0.605 | 0.534 |

FIG. 4B poly-Si

| WAVELENGTH [nm] | REFRACTIVE INDEX | ATTENUATION COEFFICIENT | ABSORPTION COEFFICIENT | TRANSMITTANCE WITH EACH FILM THICKNESS | | | | |
|---|---|---|---|---|---|---|---|---|
| | | | | 10nm | 20nm | 30nm | 40nm | 50nm |
| 400.8 | 5.45 | 0.85 | 0.027 | 0.766 | 0.586 | 0.449 | 0.344 | 0.263 |
| 450.3 | 4.68 | 0.31 | 0.009 | 0.917 | 0.840 | 0.770 | 0.706 | 0.647 |
| 499.9 | 4.30 | 0.18 | 0.004 | 0.957 | 0.915 | 0.876 | 0.838 | 0.801 |
| 549.4 | 4.09 | 0.11 | 0.003 | 0.974 | 0.949 | 0.924 | 0.900 | 0.877 |

THIN FILM TRANSISTOR AND MANUFACTURING METHOD OF THE SAME

CROSS-REFERENCE TO RELATED APPLICATION

This application is based upon and claims the benefit of priority from Japanese patent application No. 2007-179822, filed on Jul. 9, 2007, the disclosure of which is incorporated herein in its entirety by reference.

BACKGROUND OF THE INVENTION

1. Field of the Invention

The present invention relates to a thin film transistor and a manufacturing method of the same. More specifically, the present invention relates to a thin film transistor which is provided with a semiconductor thin film exhibiting photosensitivity and is used under irradiation of light, a manufacturing method of the same, an active matrix substrate obtained by using those, and electronic equipment having those loaded thereon (e.g., a display and a photosensor).

2. Description of the Related Art

As a driving device for an active-matrix type liquid crystal display panel, it is widely known to form thin film transistors (referred to as "TFT" hereinafter) on an insulating substrate such as a glass substrate. Recently, because of multi-functionalization and micronization of semiconductor devices configured including TFTs, there has been a demand for achieving such a TFT that exhibits high durability and reliability. Further, in accordance with achievement in high-definition picture quality of a liquid crystal display and expansion in its general-purpose usage, there has been an increasing demand for improving the luminance of a backlight that is loaded on the liquid crystal display.

In general, an amorphous silicon film or a polycrystalline silicon film is used for TFT. With a semiconductor material such as the aforementioned silicon, electron-hole pairs are excited/generated by an optical energy under irradiation of light. The electron-hole pairs are observed as an increase in off-leak currents, when those pairs function as carriers especially when the TFTs are off. In such case, electric charges to be held in an electric-charge latch type element such as a liquid crystal display element are changed due to a leak current. This causes deterioration in the contrast and deterioration in the picture quality such as having a cross-talk image.

In order to cope with such issues, Japanese Unexamined Patent Publication 2004-302475 (FIG. 2B, and the like: Patent Document 1) discloses a technique which shields the light irradiated to an active layer of TFT by a film that has a light-shielding function.

FIG. 9 is a sectional view showing the TFT of Patent Document 1. Explanations will be provided hereinafter by referring to this drawing. In the explanation below, polycrystalline silicon is abbreviated to "poly-Si", and amorphous silicon is abbreviated to "a-Si".

A TFT 200 is formed on a glass substrate 207, and it is provided with an WSi film 221, an insulating film 223, an a-Si film 222, an insulating film 212, a poly-Si film 211, a gate $SiO_2$ film 204, a gate Cr/$n^+$ film 210, an interlayer $SiO_2$ film 203, a wiring Ti/Al film 209, an SiN protective film 202, a flattening film 201, a pixel ITO (Indium Tin Oxide) film 208, and the like. Here, the structure from the WSi film 221 to the gate Cr/$n^+$ film 210 is referred to as the TFT 200.

With this TFT, it is intended to block the light by providing a first light-shielding film, a first insulating film, a second light-shielding film, and a second insulating film underneath a semiconductor film in this order from the bottom side. That is, as shown in FIG. 9, the TFT includes, underneath the poly-Si film 211, the WSi film 221 that is one of the light-shielding films, the insulating film 223, the a-Si film 222 as the other light-shielding film, and the insulating film 212 from the bottom side. Each of the light-shielding film is patterned to have a larger area than that of the poly-Si film 211, and each has a function of reducing the amount of light reaching to the poly-Si film 211, which makes incident from the glass substrate 207 side.

Further, in a TFT depicted in Japanese Unexamined Patent Publication 9-213964 (FIG. 1B, and the like: Patent Document 2), a laminate configured with three layers containing a light-shielding film, an insulating film, and a semiconductor film receives patterning simultaneously. Note here that the light-shielding film is made of metal such as Cr, the insulating film is made of silicon oxide, and the semiconductor film is made of Poly-Si.

However, there is a following issue with the TFT that is disclosed in Patent Document 1. As described above, the first light-shielding film, the first insulating film, the second light-shielding film, and the second insulating film are provided underneath the semiconductor film. Thus, it is necessary to go through complicated manufacturing processes such as: forming and patterning the first light-shielding film (lithography and etching), forming the second insulating film, forming and patterning the second light-shielding film, and forming the second insulating film. That is, the manufacturing processes become complicated for obtaining highly light-resistant TFT, which results in increasing the manufacturing cost.

In the meantime, in the TFT depicted in Patent Document 2, the light-shielding film is made of metal such as Cr, whereas the insulating film and the semiconductor film are made of a silicon material. Thus, it is necessary to form the insulating film and the semiconductor film by plasma CVD after forming the light-shielding film by sputtering or vapor deposition. As described, two or more kinds of film-forming devices are used for forming a laminate of the TFT of Patent Document 2. Therefore, the manufacturing processes become complicated as well, thereby resulting in increasing the manufacturing cost. Moreover, each layer of the laminate receives patterning simultaneously, so that steps in the peripheral edge of the laminate become extremely larger compared to the case where each layer receives patterning individually. Therefore, step coverage of the gate insulating film for covering the steps of the peripheral edge of the laminate becomes very poor. Thereby, a gate leak current becomes easily generated.

SUMMARY OF THE INVENTION

An exemplary object of the invention therefore is to overcome such issues, and to provide a TFT and its manufacturing method, etc., which achieves high light-resistance characteristic with suppressed light leak current at low cost by simplifying the manufacturing processes.

A TFT according to an exemplary aspect of the invention includes a light-shielding film formed on an insulating substrate, an insulating film formed on the light-shielding film, a semiconductor film formed on the insulating film, and a gate insulating film formed on the semiconductor film, wherein each layer of a laminate configured with a plurality of layers including the light-shielding film, the insulating film, and the semiconductor film is patterned simultaneously. Further, as the feature of a TFT according to the present invention, each layer of the laminate is made of silicon or a material containing silicon.

An active matrix substrate according to another exemplary aspect of the invention includes a large number of TFTs provided on an insulating substrate in lengthwise and breadthwise directions, wherein the TFTs are the thin film transistors according to the present invention.

An electronic device according to still another exemplary aspect of the invention is configured including an active matrix substrate, wherein the active matrix substrate is the active matrix substrate according to the present invention.

BRIEF DESCRIPTION OF THE DRAWINGS

FIG. 4 are tables showing the optical characteristics of a-Si and poly-Si used in the TFT of FIG. 1, in which FIG. 4A shows values regarding a-Si and FIG. 4B shows values regarding poly-Si;

FIG. 5 are graphs showing Vg-Id characteristics of the TFT shown in FIG. 1, in which

FIG. 6 are sectional views showing a second exemplary embodiment of the TFT according to the invention, in which

DETAILED DESCRIPTION OF THE EXEMPLARY EMBODIMENTS

Figure 1:
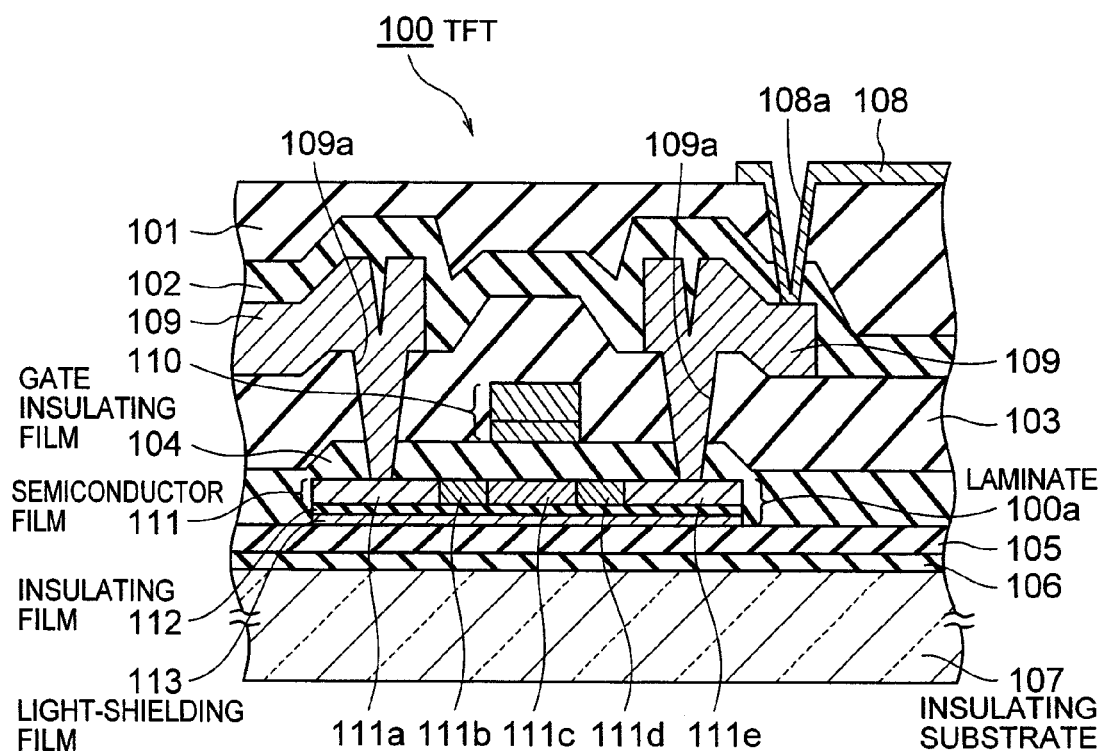
FIG. 1 is a sectional view showing a first exemplary embodiment and a third exemplary embodiment of a TFT according the invention.

FIG. 1 is a sectional view showing a first exemplary embodiment of a TFT according to the invention. Explanations will be provided hereinafter by referring to the drawing.

A TFT 100 according to this exemplary embodiment basically includes: a light-shielding film 113 formed on a glass substrate that serves as an insulating substrate 107; an insulating film 112 formed on the light-shielding film 113; a semiconductor film 111 formed on the insulating film 112; and a gate insulating film 104 formed on the semiconductor film 111. Each layer of a laminate 100a that is configured with three layers of the light-shielding film 113, the insulating film 112, and the semiconductor film 111 is patterned simultaneously. Further, each layer of the laminate 100a is configured with silicon or a material containing silicon. The light-shielding film 113 is made of a-Si, and the film thickness thereof is 10 nm, for example. The insulating film 112 is made of $SiO_2$, and the film thickness thereof is 10 nm, for example. The semiconductor film 111 is made of poly-Si, and the film thickness is 50 nm, for example. The gate insulating film 104 is made of $SiO_2$.

Light irradiated from the insulating substrate 107 is blocked by the light-shielding film 113 on the way towards the semiconductor film 111. In the meantime, the insulating film 112 prevents an electrical influence of the light-shielding film 113 imposed upon the semiconductor film 111. As a result, a light leak current of the TFT 100 can be suppressed by the light-shielding film 113 and the insulating film 112. Note there that each layer of the laminate 100a is made of silicone or a material containing silicon. Thus, by using similar film-forming gases for each layer, for example, it becomes easy to form each layer continuously by a same film-forming device. In addition, by using similar etching gases for each layer, for example, it becomes easy to perform patterning of each layer collectively by a same etching device. Therefore, the manufacturing processes can be simplified greatly compared to the case where each layer is formed and patterned separately. Further, when each layer of the laminate 100a is patterned simultaneously, there are laterally-symmetric side faces formed in the cross sections of the film-thickness direction. When patterning is performed on each layer separately, the faces of the cross sections in the film-thickness direction of the laminate become laterally asymmetric due to position shift in an alignment precision level of an exposure device.

The material containing silicon may be a material having silicon as a main component. Examples of the material having silicon as the main component are silicon oxide, silicon nitride, and silicide. Silicide is a compound of metal and silicon. Examples of silicide may be metal silicide of high melting point, such as $WSi_2$, $MoSi_2$, $TiSi_2$, and $TaSi_2$.

As in this exemplary embodiment, the semiconductor film 111 and the light-shielding film 113 may be made of silicon, and the insulating film 112 may be made of silicon oxide. In such case, it is easy to use similar film-forming gasses (for example, silane, etc.) for each layer, so that it becomes easier to form each layer continuously with a same film-forming device (for example, plasma CVD device, etc). Further, it is easy to use similar etching gasses (for example, carbon tetrafluoride, etc.) for each layer, so that it becomes easier to pattern each layer collectively with a same etching device (for example, plasma etching device, etc.).

In other words, by forming the light-shielding film 113 with silicon, the insulating film 112 with silicon oxide, and the semiconductor film 111 with silicon, it becomes easy to share the film-forming device in film-forming steps, i.e., becomes easier to form the films continuously with a single film-forming device, and becomes easier to perform processing collectively also at the time of etching by a dry-etching device that is used for patterning the semiconductor film.

As in this exemplary embodiment, the semiconductor film 111 may be made of poly-Si and the light-shielding film 113 may be made of a-Si. Poly-Si has larger carrier mobility than that of a-Si, so that it is suited for the semiconductor film 111 of the TFT. Meanwhile, a-Si has better light absorption rate than that of poly-Si, so that it is suited for the light-shielding film 113.

Further, the total sum of each layer of the laminate 100a is desirable to be equal to or less than the film thickness of the gate insulating film 104. In this case, when the height of the steps in the peripheral edge of the laminate 100a becomes equal to or less than the film thickness of the gate insulating film 104, the steps can be easily covered with the gate insulating film 104 completely. Therefore, step coverage of the gate insulating film 104 can be improved.

Next, the TFT 100 according this exemplary embodiment will be described in more details. Hereinafter, material names of each film are written in parentheses after the respective films as necessary.

In the TFT 100 of this exemplary embodiment, the semiconductor film (poly-Si) 111 is provided on the insulating substrate (glass) 107 via a base film (SiN) 106, a base film (SiO$_2$) 105, the light-shielding film (a-Si) 113, and the insulating film (SiO$_2$) 112. The semiconductor film 111 includes a source region 111a, an LDD (Lightly Doped Drain) region 111b, a channel region 111c, an LDD region 111d, and a drain region 111e from the left side of the drawing. The source region 111a and the drain region 111e are a pair of impurity regions that are connected to a pair of wiring films (Ti/Al) 109. The channel region 111c is at a position right beneath a gate electrode (Cr/n$^+$) 110. The LDD regions 111b, 111d are a pair of low-concentration impurity regions which are formed between the channel region 111c and the source region 111a, and between the channel region 111c and the drain region 111e. Note here that the structure from the light-shielding film 113 to the gate electrode 110 is referred to as the TFT 100.

The gate insulating film 104 is provided to cover the semiconductor film 111, and the gate electrode 110 and an interlayer insulating film (SiO$_2$)103 are provided thereon. The wiring films 109 as the source electrode and the drain electrode are provided thereon via contact holes 109a. Further, a protective film (SiN) 102 and a flattening film 101 are provided thereon, and a pixel film (ITO) 108 is provided thereon via a contact hole 108a. The pixel film 108 functions as a pixel electrode of a liquid crystal display.

Unlike single-crystal silicon, the poly-Si thin film has polycrystalline grain boundaries. Thus, when a high electric field is applied to the end of the drain, there is a leak current flown between bands via defects existing in the grain boundaries. Therefore, an off-leak current of the TFT configured with the poly-Si thin film becomes increased depending on a drain-gate voltage. Thus, an LDD structure is employed to ease the electric field of the drain end in order to resolve the drain-gate voltage dependency of the off-leak current.

In this way, the off-leak current when the TFT 100 is in a dark state can be reduced. However, when light is irradiated to the semiconductor film 111, the leak current becomes increased in accordance with the amount of the light. In this exemplary embodiment, the light-shielding film 113 is provided underneath the semiconductor film 111 via the insulating film 112, so that the amount of light reaching to the semiconductor film 111 can be reduced due to reflection and absorption by the light-shielding film 113. Therefore, the light off-leak current is reduced compared to the case including no light-shielding film 113.

FIG. 2 and FIG. 3 are sectional views showing a first exemplary embodiment of a manufacturing method of the TFT according to the present invention. Explanations will be provided hereinafter by referring to the drawings. Same reference numerals are applied to the components that are the same as those in FIG. 1, and explanations thereof are omitted.

The manufacturing method according to this exemplary embodiment is a method for manufacturing the TFT 100 of FIG. 1, which is characterized to perform patterning on each layer of the laminate 100a simultaneously after continuously forming each layer of the laminate 100a on the insulating substrate 107 in a same film-forming device.

Note here that each layer of the laminate 100a is made of silicon or a material containing silicon. Therefore, it becomes easier to form each layer continuously with a same film-forming device (for example, plasma CVD device, etc.) by using similar film-forming gasses (for example, silane, etc.) for each layer. Further, it becomes easier to perform patterning on each layer collectively with a same etching device (for example, plasma etching device, etc.) by using similar etching gasses (for example, carbon tetrafluoride, etc.). Therefore, the manufacturing processes can be simplified greatly compared to the case where each layer is formed separately and patterned separately.

Next, the manufacturing method according to this exemplary embodiment will be described in more details.

Figure 2A:
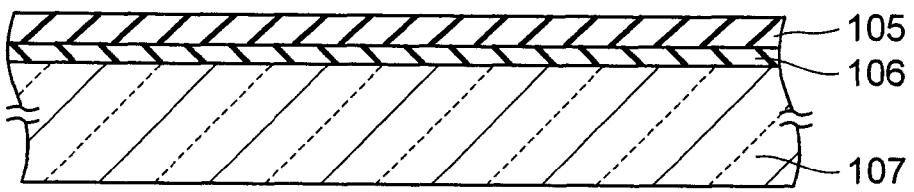
FIG. 2 shows first sectional views showing a first exemplary embodiment and a second exemplary embodiment of a manufacturing method of the TFT according to the invention, and the procedure advances in order of FIG. 2A-FIG. 2C.
Figure 2B:
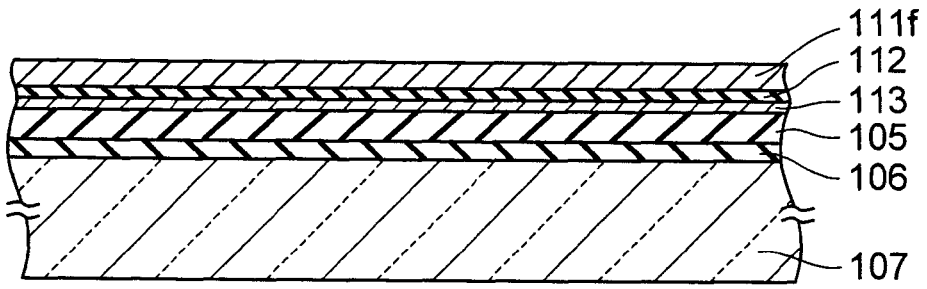

First, as shown in FIG. 2A and FIG. 2B, after cleaning the insulating substrate (glass) 107, the base film (SiN) 106, the base film (SiO$_2$) 105, the light-shielding film (a-Si) 113, the insulating film (SiO$_2$) 112, and an a-Si film 111f are formed continuously on the insulating substrate 107 by using a plasma CVD (Chemical Vapor Deposition) device. The a-Si film 111f on the top face is changed into the semiconductor film (poly-Si) 111 in a crystallization step. For the crystallization step, it is possible to employ a solid phase growth method using heat, a laser crystallization method using an excimer laser or a YAG (Yttrium Aluminum Garnet) laser, or a crystalline growth method using a catalyst.

Figure 2C:
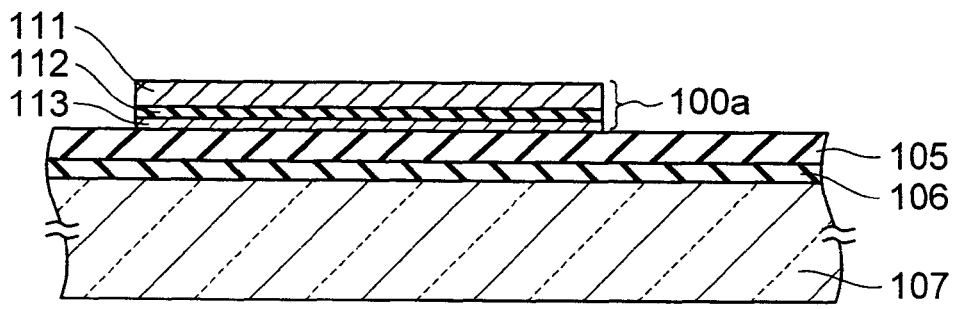

Subsequently, as shown in FIG. 2C, after completing the crystallization step, the semiconductor film 111, the insulating film 112, and the light-shielding film 113 are patterned collectively in a photoresist step and a dry-etching step so as to obtain the laminate 100a. All of those films are made of silicon-based materials, so that it is possible to perform processing continuously by dry-etching using a mixed gas of CF$_4$ and oxygen.

As described, it is possible to perform processing of the film-forming step by a single film-forming device. Thus, cleaning and conveyance of the layers required when each layer is formed separately can be omitted. In addition, it is possible to perform processing of the etching step by a single etching device, so that cleaning and conveyance of the layers required when each layer is etched separately can be omitted. Therefore, an increase in the number of steps for giving a light-resistance characteristic to the TFT 100 can be suppressed to minimum.

Subsequently, as shown in FIG. 3, in the semiconductor film 111, the source region 111a and the drain region 111e as the pair of impurity regions connected to the wiring films (Ti/Al) 109 are formed by an ion doping method. Further, the channel region 111c right beneath the gate electrode 110 is cleaned by using functional water or acid so as to have a clean interface with the gate insulating film (SiO$_2$) 104. The pair of LDD regions 111b, 111d between the channel region 111c and the pair of source region 111a and the drain region 111e are formed by an ion implantation method in a self-aligning manner after forming the gate insulating film 104 and the gate electrode (Cr/n$^+$) 110.

Figure 3A:
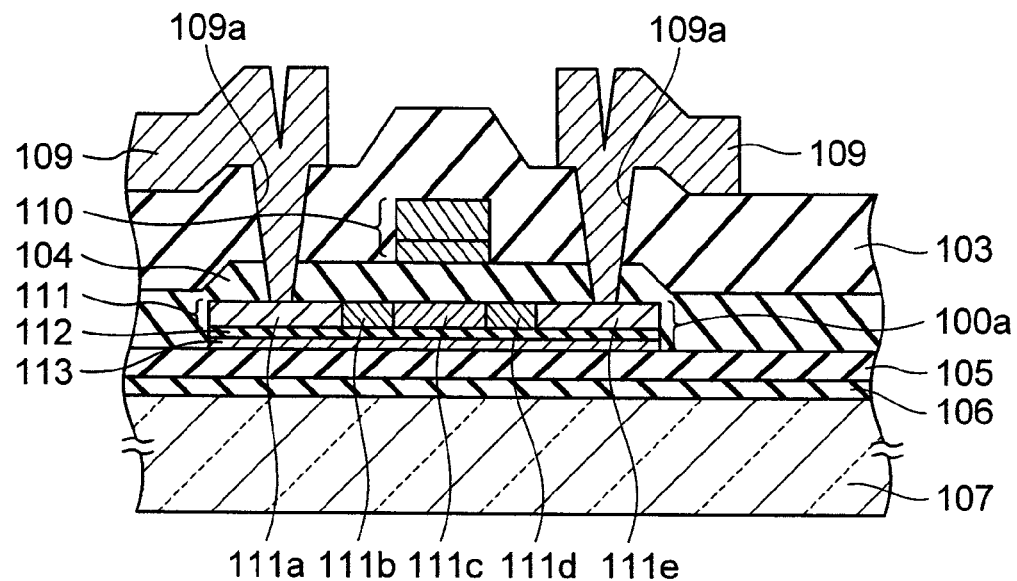
FIG. 3 shows second sectional views showing the first exemplary embodiment and the second exemplary embodiment of the manufacturing method of the TFT according to the invention, and the procedure advances in order of FIG. 3A to FIG. 3B.
Figure 3B:
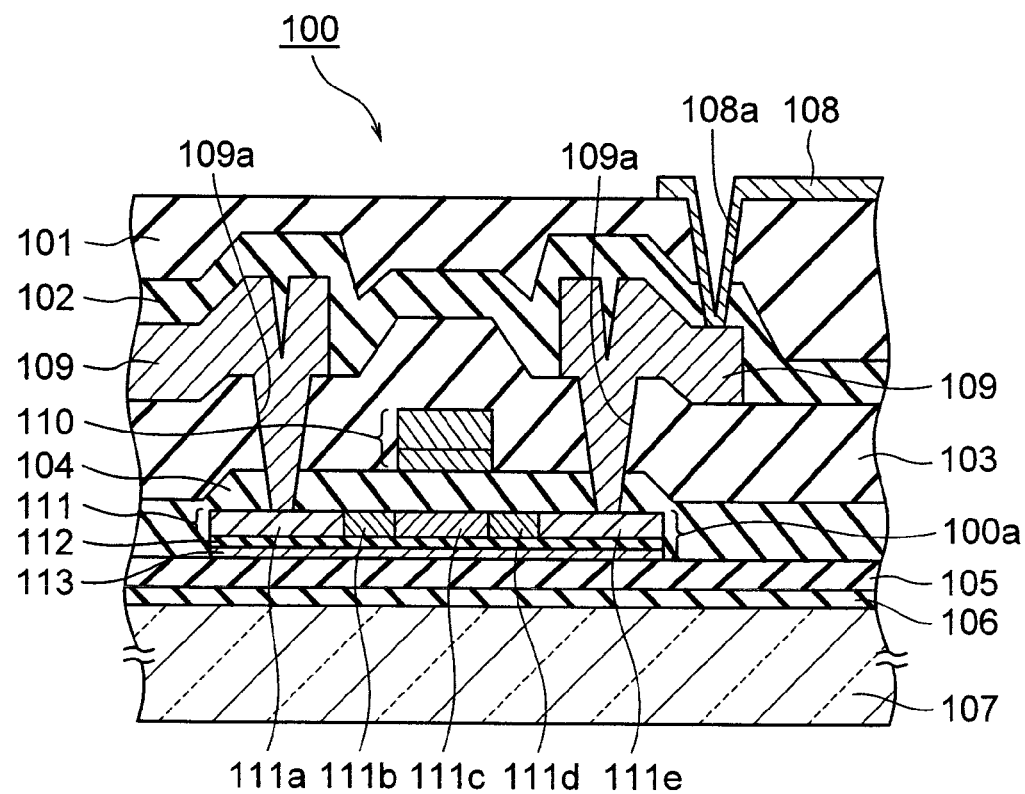

Subsequently, after forming the interlayer insulating film (SiO$_2$) 103, a heat treatment is applied inside an electric furnace so as to electrically activate the above-described impurities. Then, after forming the contact holes 109a, the wiring films (Ti/Al) 109 are formed and patterned (FIG. 3A). Thereafter, passivation is performed on the protective film (SiN) 102, and the flattening film 101 is then applied to flatten the surface. Further, the pixel film (ITO) 108 is provided via the contact hole 108a to form the pixel electrode (FIG. 3B).

FIG. 4 shows tables showing the optical characteristics of a-Si and poly-Si used for the TFT shown in FIG. 1. Explanations will be provided hereinafter by referring to FIG. 1 and FIG. 4.

A back light used on a liquid crystal display is a white light source, so that light with wavelengths of 400-700 nm is irradiated to the TFT 100. Among those, light corresponding to blue and green on the short-wavelength side has high energy. Thus, it tends to excite optical carriers in poly-Si. In addition, the absorption coefficient of poly-Si becomes large on the short-wavelength side. Further, in a case of an LED (Light Emitting Diode) backlight, the peak of the light intensity is with the wavelengths of about 450 nm and 550 nm in many cases. Therefore, it is effective to improve the light-shielding performance for the wavelengths of 400 nm-500 nm.

In the meantime, it is desirable for the light-shielding film 113 and the insulating film 112 to be thin in terms of the productivity and the cost. It is obvious that the light-shielding performance can be increased with thicker films. However, the film-forming step and the etching step can be shortened if the necessary light-shielding performance can be obtained with the films that are formed as thin as possible.

According to FIG. 4, it is necessary for the a-Si thin film to have the film thickness of 10 nm-20 nm and for the poly-Si thin film to have the film thickness of 50 nm or more in order to reduce the amount of transmitting light with the wavelength of about 450 nm by half.

Further, when there is an increase in the total sum of the thicknesses of the light-shielding film 113, the insulating film 112, and the semiconductor film 111, a step coverage performance of the gate insulating film 104 is required. It is because the gate leak current via the gate insulating film 104 tends to be generated with fragile step coverage, which results in interfering with the substantial transistor actions. Therefore, it is desirable to use a-Si, which can achieve a higher light-shielding performance than that of poly-Si even with a thinner film-thickness, for the light-shielding film 113 as shown in FIG. 4.

At the time of performing crystallization of the poly-Si film formed on the a-Si, the a-Si may also be crystallized simultaneously. Thus, in a case of employing the solid phase growth method, for example, it is preferable to have its amorphous characteristic increased than the a-Si film that is to be made into poly-Si in advance for extending the incubation time until generation of crystalline nucleuses or to have its impurity concentration increased so as to hinder the crystallization. In the meantime, in a case of employing a crystallization step using light such as excimer laser annealing, it is desirable to keep the state of a-Si through avoiding heat by using short-wavelength light so that the light does not reach to the a-Si of the light-shielding film or by suppressing the thermal conductivity of the insulating film 112, for example.

Further, the poly-Si film can be used as the light-shielding film 113. The poly-Si thin film exhibits a higher translucent characteristic with the short-wavelength compared to that of the a-Si thin film. Thus, it is formed to have a thickness of 50 nm and the insulating film 112 is formed to be 10 nm, for example. The light-shielding film 113 of this case may be formed by depositing a poly-Si film in advance, or may be poly-crystallized at the time of crystallizing the semiconductor film 111 simultaneously after depositing the a-Si. The insulating film 112 formed in the latter method is desirable to be formed as thin as possible as long as it can keep the insulating characteristic, for achieving a fine thermal conductivity.

Figure 5A:
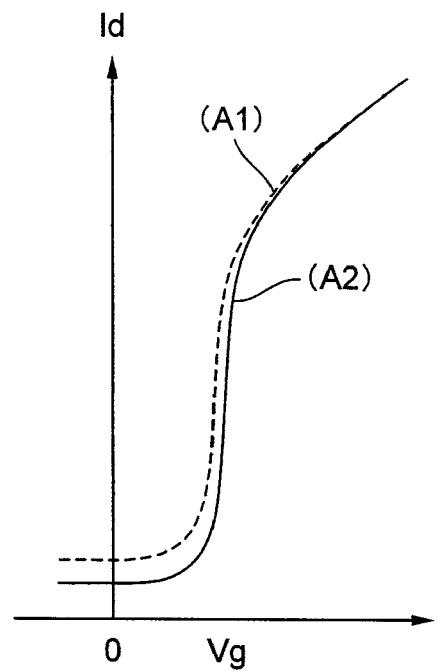
FIG. 5A shows a case of n-channel TFT and FIG. 5B shows a case of p-channel TFT.
Figure 5B:
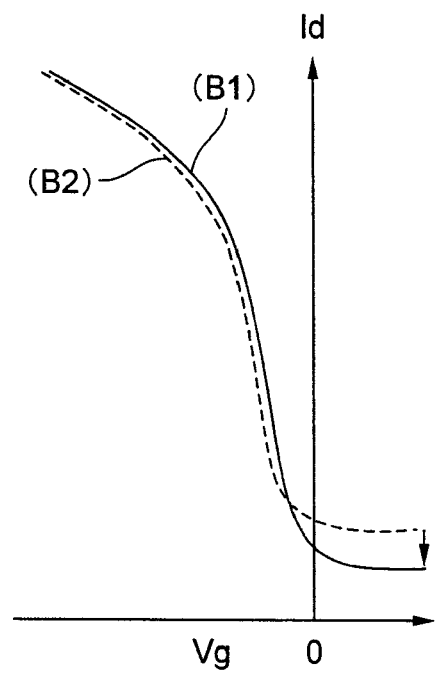

FIG. 5 shows graphs showing Vg-Id characteristics of the TFT shown in FIG. 1. FIG. 5A shows a case of n-channel TFT, and FIG. 5B shows a case of p-channel TFT. Explanations will be provided hereinafter by referring to FIG. 1 and FIG. 5.

50 nm of the base film (SiN) 106, 100 nm of the base film (SiO$_2$) 105, 20 nm of the a-Si film as the light-shielding film 113, 30 nm of the SiO$_2$ film as the insulating film 112, 50 nm of the poly-Si film as the semiconductor film 111, and other films were formed on the insulating substrate 107 to fabricate the TFTs 100. The light leak current was reduced greatly with the TFTs (A2), (B2) of the exemplary embodiment with the light-shielding structure compared to that of the TFTs (A1), (B1) of a comparative example that does not employ the light-shielding structure. With a liquid crystal display using the TFTs (A2) and (B2) of the exemplary embodiment, it was possible to reduce the amount of longitudinal crosstalk from 3% to 1%.

FIG. 6 shows sectional views showing a second exemplary embodiment of the TFT according to the invention. Explanations will be provided hereinafter by referring to FIG. 1 and FIG. 6. In FIG. 6, the components that are same as those of FIG. 1 are omitted or illustrated with the same reference numerals, and explanations thereof are omitted.

The laminate 100a of FIG. 1 has each layer patterned simultaneously, so that the steps in the peripheral edge of the laminate 100a become larger compared to the case where each layer is individually patterned. By forming the steps in the peripheral edge of the laminate 100a into a tapered form or in gently sloped step form, the step coverage of the gate insulating film 104 can be improved. Note here that "tapered form" and "step form" includes a combination of those forms as well.

The laminate 100a including the light-shielding film 113, the insulating film 112, and the semiconductor film 111 is patterned simultaneously with the semiconductor film 111. The thickness of those films is designed to be within a range that can be sufficiently covered by the gate insulating film 104. The characteristics of the TFT 100, i.e., ON current and the threshold voltage, depend not only on the material and on the film quality of the semiconductor film 111 but also on the film quality and the film thickness of the gate insulating film 104. Reduction in the film thickness of the gate insulating film 104 is advanced in accordance with a demand for improving the performance of the TFT 100, so that it becomes necessary to figure out away to keep the step coverage for satisfying such demand. By forming the steps in the tapered form or step form from the lower layers to the upper layers, the step coverage can be improved.

Figure 6A:
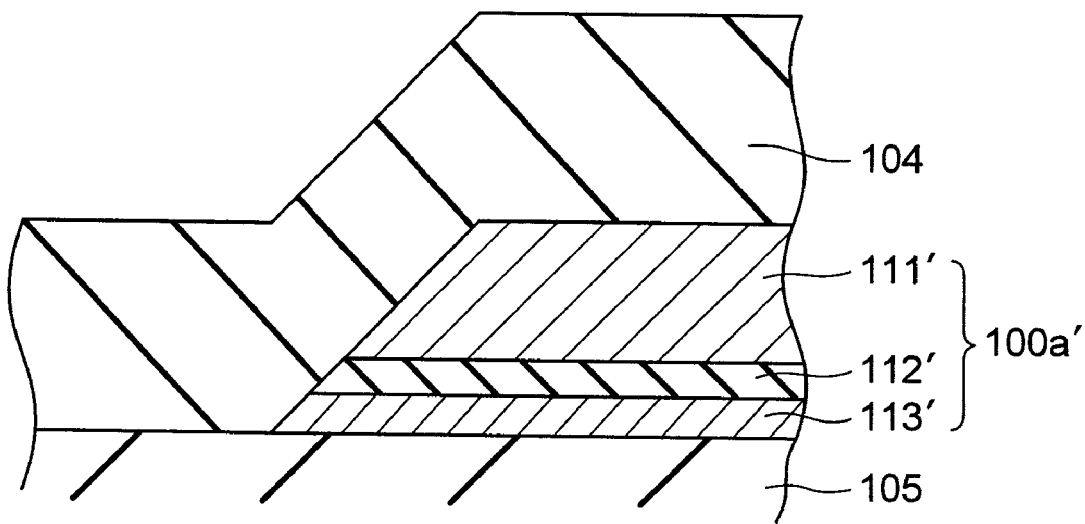
FIG. 6A shows an example of a tapered from and FIG. 6B shows an example of a step form.
Figure 6B:
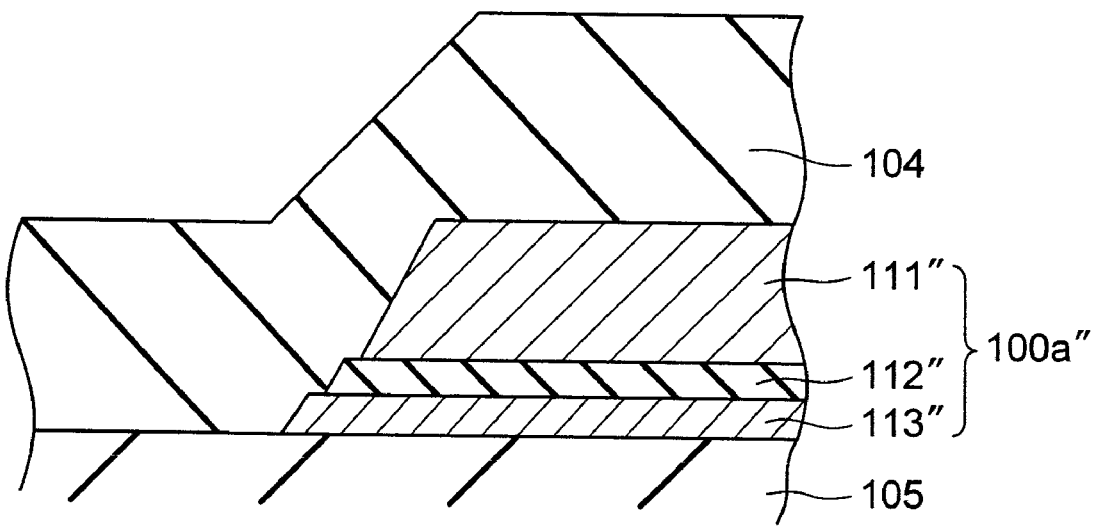

That is, a laminate 100a' of FIG. 6A is patterned in a tapered form in such a manner that its sectional shape becomes smaller towards the upper side in the film-thickness direction. A laminate 100a" of FIG. 6B is patterned in a step form in such a manner that the sectional shape becomes smaller towards the upper side in the film-thickness direction. Thereby, sufficient step coverage can be achieved even when reduction in the film thickness of the gate insulating film 104 is advanced.

Further, it is desirable for the film thickness of the light-shielding film 113 to be equal to or less than that of the semiconductor film 111, and desirable for the sum of the film thicknesses of the light-shielding film 113 and the insulating film 112 to be equal to or less than that of the semiconductor film 111. Furthermore, by forming the total sum of the film thicknesses of the light-shielding film 113, the insulating film 112, and the semiconductor film 111 to be equal to or less than that of the gate insulating film 104, it becomes possible to obtain the sufficient step coverage. These also apply for light-shielding films 113', 113", insulating films 112', 112", and semiconductor film 111', 111" shown in FIG. 6.

The tapered form may be in a straight-line shape with each layer having a same tapered angle, or, the tapered angles may vary for each layer, since the tapered angles of each layer depend on the types of films and etching conditions of each layer. While the types of the films and the forms (step form, tapered form) are illustrated as a combination in this exemplary embodiment, it is not intended to be limited to that combination. It is possible to achieve a semiconductor device with still higher reliability by forming the total sum of the light-shielding film, the insulating film, and the semiconductor film to be equal to or less than that of the gate insulating film and by employing a contrivance such as the above-described forms.

Next, a manufacturing method of the tapered-form laminate 100a' shown in FIG. 6A will be described. It is assumed here that the light-shielding film 113' is made of a-Si, the insulating film 112' is made of $SiO_2$, and the semiconductor film 111' is made of poly-Si. A photoresist film in a prescribed shape is formed on the semiconductor film 111', and plasma etching is performed by using a mixed gas of carbon tetrafluoride and oxygen. In general, the more the proportion of carbon tetrafluoride is, the larger the etching rate of $SiO_2$ becomes. Inversely, the more the proportion of the oxygen is, the larger the etching rate of Si becomes. Therefore, the etching rate of $SiO_2$ and that of Si can be made almost equal by optimizing the mixing ratio of carbon tetrafluoride and oxygen. When plasma etching is performed with such optimum condition, it is possible with isotropic etching to obtain the tapered-form laminate 100a' that is shown in the drawing. As described, the light-shielding film 113', the insulating film 112', and the semiconductor film 111' according to this exemplary embodiment are made of silicon or a material containing silicon, so that it is easy to perform tapered-form etching on those entire three layers.

Next, a manufacturing method of the step-form laminate 100a" shown in FIG. 6B will be described. It is assumed here that the light-shielding film 113" is made of a-Si, the insulating film 112" is made of $SiO_2$, and the semiconductor film 111" is made of poly-Si. A photoresist film in a prescribed shape is formed on the semiconductor film 111", and plasma etching is performed by using a mixed gas of carbon tetrafluoride and oxygen. In general, the more the proportion of carbon tetrafluoride is, the larger the etching rate of $SiO_2$ becomes. Inversely, the more the proportion of the oxygen is, the larger the etching rate of Si becomes. Further, as the etching proceeds, the film thickness of the photoresist film decreases, and the peripheral edge becomes chipped off. Thus, by setting the condition thereof so that Si is etched before $SiO_2$ and by utilizing recession of the peripheral edge of the photoresist film, the semiconductor film 111" becomes recessed and the flat face of the insulating film 112" appears. Then, when it is changed to a condition with which $SiO_2$ is etched before Si, the insulating film 112' is recessed and the flat face of the light-shielding film 113" appears. With this, the step-form laminate 100a" that is shown in the drawing can be obtained. As described, the light-shielding film 113", the insulating film 112", and the semiconductor film 111" according to this exemplary embodiment are made of silicon or a material containing silicon, so that it is easy to perform step-form etching on those entire three layers.

As an exemplary advantage according to the invention, each layer of the laminate including the light-shielding film, the insulating film, and the semiconductor film is configured with silicon or a material containing silicon. Therefore, each layer can be formed continuously by a same film-forming device, and each can receive patterning collectively by a same etching device. Thus, the manufacturing processes can be simplified greatly. As a result, it becomes possible to achieve the TFT having high light-resistance characteristic with suppressed light leak current.

Next, a second exemplary embodiment of the manufacturing method of the TFT according to the present invention will be described by referring to FIG. 2 and FIG. 3. This exemplary embodiment will be described in more details than the first exemplary embodiment by using numerical values and the like.

First, 150 nm of a silicon oxide film is formed on the insulating substrate (glass) 107 as the base film ($SiO_2$) 105 (FIG. 2A). In this exemplary embodiment, the base film (SiN) 106 is omitted.

Then, 30 nm of an a-Si film to be the light-shielding film 113 is formed on the base film 105. Further, 20 nm of a silicon oxide film to be the insulating film 112 and 30 nm of an a-Si film to be the semiconductor film 111 are formed (FIG. 2B). Each of these layers is made of silicon or a material containing silicon, so that it is possible to form those layers continuously by a plasma CVD device, for example, by using a gas such as silane as a raw material. Here, a very small amount (for example, about $1\times10^{12}$ $cm^{-2}$ concentration) of impurity such as boron or phosphorous is mixed at the time of forming the films, or such impurity is inserted by ion doping or ion implantation after forming the films in order to control the threshold voltage Vth. Furthermore, an excimer laser or the like is irradiated to the a-Si film to form the poly-Si film with an excellent characteristic. The poly-Si film functioning as the semiconductor film 111 is desirable to be thin, since generation of the optical carries can be suppressed better when the film has a smaller volume.

Note here that silicide may be used as the light-shielding film 113 as described above. Here, for the case of $WSi_2$, for example, it is possible to form the light-shielding film 113 continuously with other films by the plasma CVD device by using a mixed gas of tungsten hexafluoride and silane.

Subsequently, the poly-Si film as well as the silicon oxide film and the a-Si film provided thereunder are patterned into a prescribed shape by lithography and dry etching (FIG. 2C). Here, the poly-Si film is patterned with $CF_4/O_2$ gas, a flow rate of 180 sccm/100 sccm, a gas pressure of 30 Pa, and a discharge power of 500 W. Thereafter, the layers thereunder are etched with $CF_4/O_2$ gas, a flow rate of 120 sccm/30 sccm, a gas pressure of 10 Pa, and a discharge power of 2000 W, or $CHF_3/CO$ gas, a flow rate of 120 sccm/30 sccm, a gas pressure of 2 Pa, and a discharge power of 2000 W.

As the gate insulating film 104, a silicon oxide film is formed by a plasma CVD method. Here, plasma CVD is executed at 600 degrees C. or lower, which is the temperature at which the insulating substrate (glass) 107 is deformed greatly. At this time, a mixed gas containing at least oxygen gas and organic silane having an ethoxy group such as tetra-ethoxysilane (referred to as "TEOS" hereinafter) is used as a material gas.

When forming the gate insulating film 104, decomposition of the organic silane such as TEOS can be promoted by controlling the RF power density of the plasma CVD device. Further, it becomes possible to sufficiently supply an intermediate product containing oxygen that is required for the reaction with the decomposed silane through controlling rate of the flow of the organic silane to the flow of the oxygen gas when forming the gate insulating film 104. Therefore, it is preferable to control the RF power density when forming the film 104 to be 0.690-1.553 $W/cm^2$ and the rate of the flow of the oxygen gas (F0) to the flow of the organic silane (F1) when forming the film 104 to be 50-500 (F0/F1) at the same time. Through controlling the RF power density and the rate of the gas flow to fall within those ranges, the organic silane such as TEOS can be sufficiently decomposed. Therefore, it becomes easier to control the content of $CO_2$ and $H_2O$ within the formed silicon oxide film.

Further, when forming the gate insulating film 104, it is preferable to form the entire gate insulating film 104 under a same forming condition. If the forming condition is not identical and the processing is divided into two stages or more, it is not possible to obtain the gate insulating film 104 with a uniform film quality. Thus, a TFT with a small fluctuation in the electric characteristic may not be obtained. Further, variations between the elements may become significant.

Subsequently, a gate electrode film to be the gate electrode (Cr/n+) 110 is formed on the gate insulating film 104. A metal film formed by sputtering, an impurity-added silicon film formed by a CVD method or the like, or a laminated film of those is used as the gate electrode film. The impurity herein means boron or phosphorous, which is mixed by changing the concentration and the type thereof in order to control the threshold value. After forming a photoresist pattern on the gate electrode film, the gate electrode 110 is formed by either or both of dry etching and wet etching.

Then, in order to form the source region 111a and the drain region 111e, a photoresist pattern is formed thereon, and high-concentration impurity is added by ion doping of ion implantation by having the photoresist pattern as a mask. Boron is used for the impurity for forming a p-channel TFT, and phosphorous is used for forming an n-channel TFT. Thereafter, the photoresist pattern is removed.

Further, in order to form the LDD regions 111b and 111d, an impurity of lower concentration than that of the source region 111a and the drain region 111e is added by having the gate electrode 110 as a mask. Boron is used for the impurity for forming a p-channel TFT, and phosphorous is used for forming an n-channel TFT. This exemplary embodiment has been described by referring to the case where the source region 111a and the drain region 111e are formed after forming the gate electrode 110. However, the same effect can be achieved even when those regions are formed before forming the gate electrode 110.

Subsequently, a silicon oxide film, a silicon nitride film, or a laminated film of those is formed as the interlayer insulating film 103 by a plasma CVD method or the like. Then, a heat treatment for activating the impurity is applied in a furnace at a relatively high temperature (for example, 300 degrees C. or higher). A method of irradiating an excimer laser may be employed for activation of this impurity.

Thereafter, the contact holes 109 are formed on the source region 111a, the drain region 111e, and the gate electrode 110 by performing lithography, and either or both of dry etching and wet etching.

Subsequently, a metal film for allowing contact with the source region 111a, the drain region 111e, and the gate electrode 110 is formed by sputtering. Furthermore, the wiring films (Ti/Al) 109 are formed by performing patterning through lithography, and either or both of dry etching and wet etching (FIG. 3A).

With this, the basic structure of the TFT 100 is completed. In some cases, a hydrogen plasma treatment is applied to the poly-Si film and the interface between the poly-Si film and the gate insulating film so as to terminate existing dangling bonds with hydrogen. The hydrogen plasma treatment may be applied at the final stage or may be applied after the heat treatment applied for activating the impurity.

Thereafter, depending on the usage of the TFT 100, another electrode film, passivation film, interlayer insulating film, flattening film, capacitance insulating film, and the like are formed as necessary (FIG. 3B). Further, an active matrix substrate according to the present invention can be formed by going through the above-described steps so as to arrange the TFTs according to the present invention at prescribed positions.

Next, a third exemplary embodiment of the TFT according to the present invention will be described by referring to FIG. 1.

With the present invention, the steps to be covered by the gate insulating film 104 are larger than the case of covering only the semiconductor film 111. Thus, the gate insulating film 104 is required to have a high insulating performance.

When organic silane such as TEOS is used for forming the silicon oxide film as the gate insulating film 104, an intermediate product containing carbon remained due to insufficient decomposition of the organic silane is contained in the silicon oxide film. Further, when the silicon oxide film is formed by a chemical gas phase growth method such as plasma CVD or low-pressure CVD, relatively large amount of $H_2O$ is contained in the silicon oxide film. When these substances exist in the gate insulating film 104 of the TFT, the operation reliability of the TFT 100 becomes deteriorated. Thus, by employing the gate insulating film 104 containing $CO_2$ for the TFT 100, the operation reliability of the TFT 100 can be improved.

While the reason for this is not fully resolved at this point, it is estimated as follows. That is, $H_2O$ and the intermediate product containing the carbon remained due to insufficient decomposition of the organic silane tend to be captured into pores of the silicon oxide film. When $CO_2$ is adsorbed to the pores of the silicon oxide film, the content of the above-described $H_2O$ and intermediate product contained in the silicon oxide film can be reduced.

Further, because $CO_2$ is a stable compound, the use of silicon oxide film containing $CO_2$ as the gate insulating film 104 makes it possible to ease an influence by hot carries that are generated while the TFT 100 is in operation. Thereby, it is possible to suppress fluctuation of the electric characteristic of the TFT 100. In particular, carriers (electric charges) inserted to the gate insulating film 104 while the TFT is in operation are inserted in the vicinity of the poly-Si film, thereby giving a large influence on the characteristic of the gate insulating film 104 that is located in the vicinity of the poly-Si film. Therefore, it is desirable for $CO_2$ to be present on the side closer to the poly-Si film, which is a region of about 10% of the film thickness of the gate insulating film 104.

There is a large peak attributed to Si—O observed in the vicinity of the wave number of 1060 $cm^{-1}$ in the infrared absorption spectrum of the silicon oxide film. When $CO_2$ is contained in the silicon oxide film, there is observed a peak in the vicinity of the wave number of 2340 $cm^1$ in the infrared absorption spectrum. When the peak area intensity in the vicinity of the wave number of 2340 $cm^{-1}$ is $8\times10^{-4}$ times or more of the peak area intensity in the vicinity of the wave number of 1060 $cm^{-1}$, it is considered that the silicon oxide film contains $CO_2$ in about an amount that suppresses the fluctuation of the electric characteristic when a voltage is applied for a long time to the gate electrode 110 of the TFT 100.

Further, when the number of $H_2O$ contained in the silicon oxide film (gate insulating film 104) in the vicinity of the poly-Si film is $9\times10^{20}$/cc or less, not only the fluctuation of the electric characteristic in the TFT 100 when a voltage applied for a long time can be suppressed, but also variation in the electric characteristic of the TFT 100 caused due to $H_2O$ (e.g., variation in the threshold voltage Vth between the substrates) can be suppressed.

The TFT 100 using the above-described silicon oxide film containing $CO_2$ for the gate insulating film 104 can provide high operation reliability, thereby exhibiting a high step coverage performance. Thus, the active matrix substrate having the TFTs 100 loaded thereon can provided high operation reliability.

Figure 7:
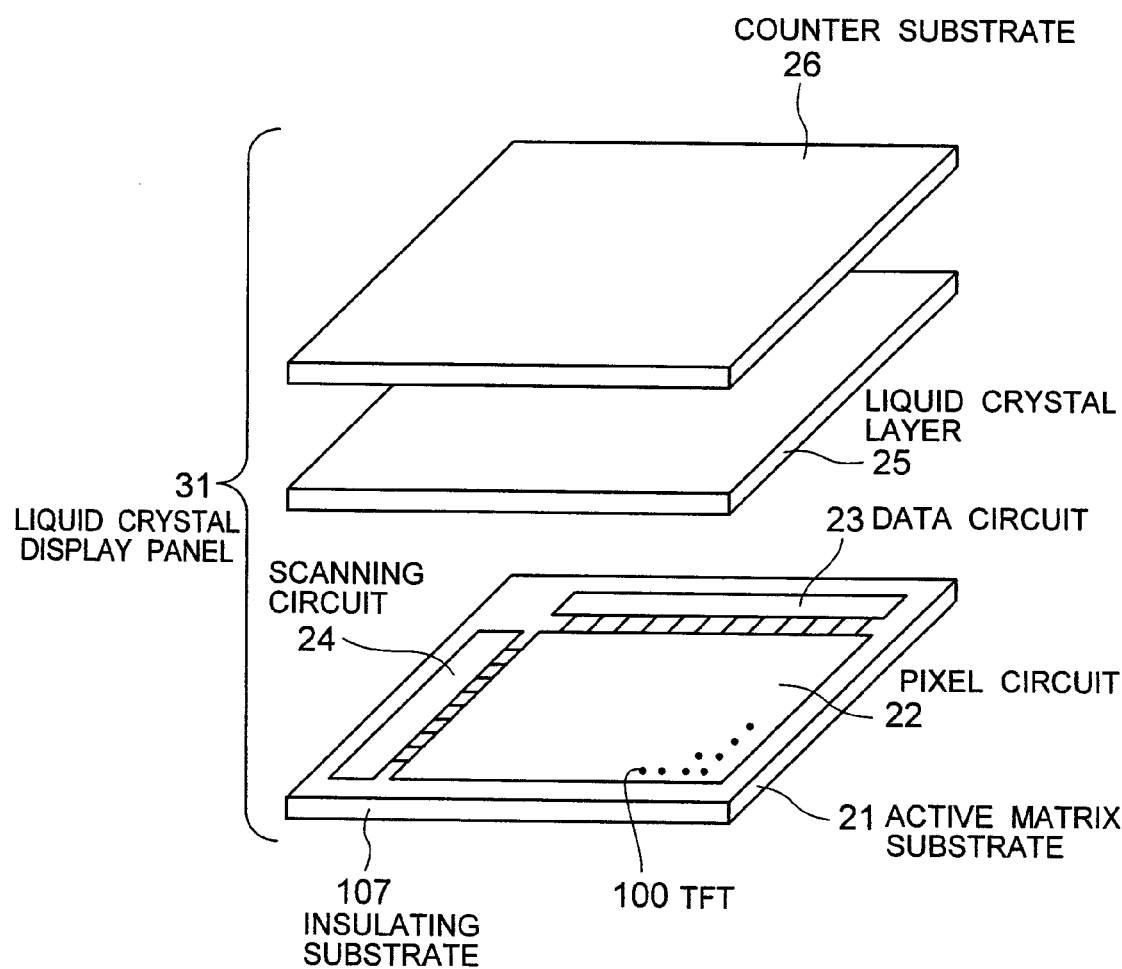
FIG. 7 is a perspective view showing a first exemplary embodiment of an active matrix substrate according to the invention.

FIG. 7 is a perspective view showing a first exemplary embodiment of the active matrix substrate according to the present invention. Explanations will be provided hereinafter by referring to the drawing.

An active matrix substrate 21 of this exemplary embodiment is configured by providing a large number of TFTs 100 (a part thereof is shown with black dots in the drawing) on the insulating substrate 107 in lengthwise and breadthwise directions. The TFTs 100 may be any of the TFTs disclosed in each of the above-described exemplary embodiments. The use of the TFTs 100 makes it possible to obtain the active matrix substrate 21 that is low at cost and excellent in the light-resistance characteristic.

This will be described in more details. This exemplary embodiment is an example of applying the active matrix substrate 21 to a liquid crystal display panel 31. In the liquid crystal display panel 31 illustrated in a disassembled manner, there are the active matrix substrate 21 (refereed to as TFT substrate as well) and a counter substrate 26, which are provided in parallel and by being isolated from each other. Further, a liquid crystal layer 25 is provided between the active matrix substrate 21 and the counter substrate 26. Further, in the active matrix substrate 21, a pixel circuit 22, a data circuit 23, and a scanning circuit 24 are formed on the side that opposes to the counter substrate 26 of the insulating substrate 107.

The liquid crystal display panel 31 according to the exemplary embodiment has the TFTs 100 with the reduced light leak current. Thus, it is possible to operate stably even when a high-luminance backlight is used. Thus, the display performance of the liquid crystal display panel 31 can be improved.

Figure 8:
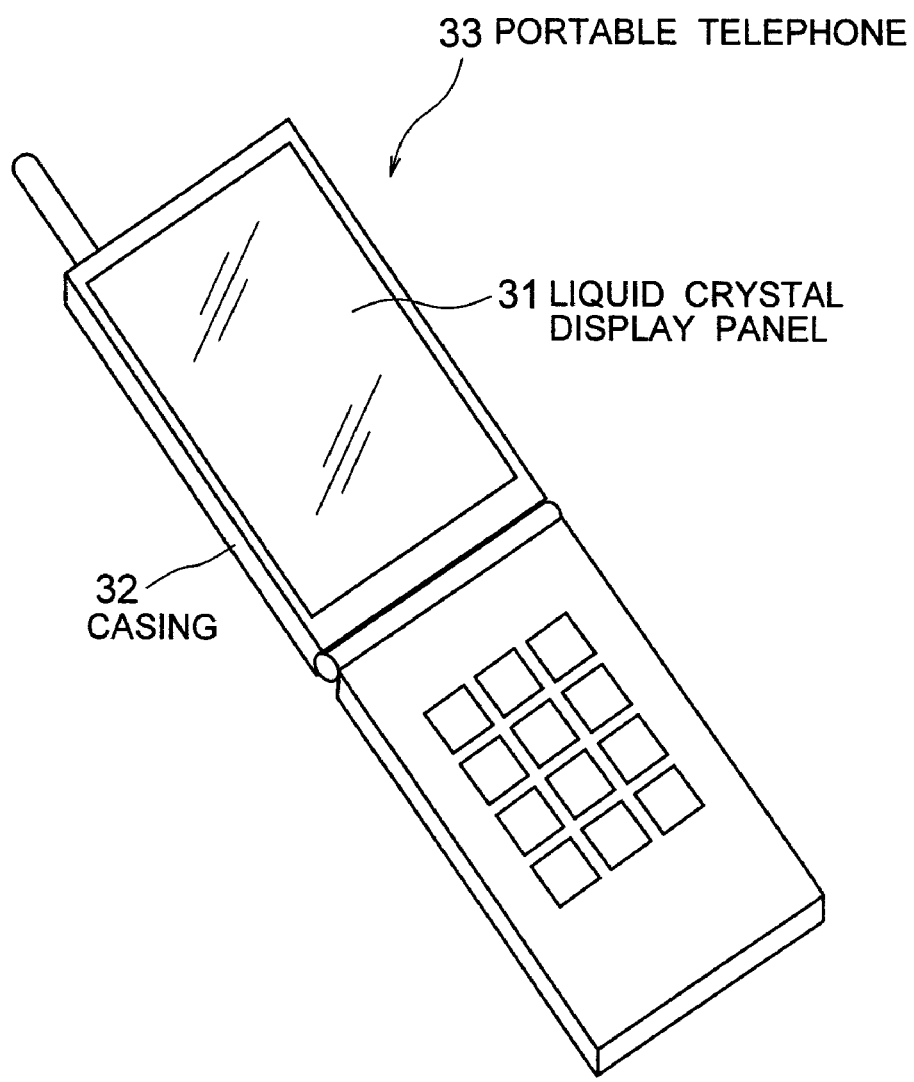
FIG. 8 is a perspective view showing a first exemplary embodiment of an electronic device according to the invention.
Figure 9:
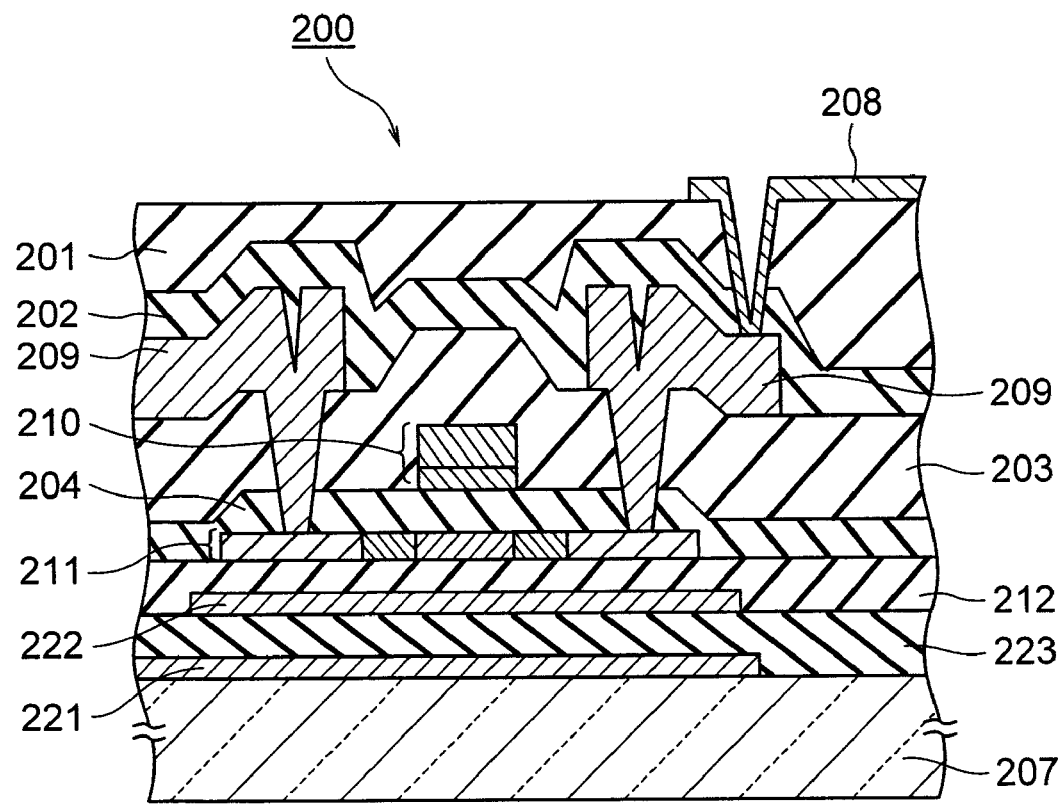
FIG. 9 is a sectional view showing a TFT depicted in Patent Document 1.

FIG. 8 is a perspective view showing an exemplary embodiment of an electronic device according to the invention. Explanations will be provided hereinafter by referring to the drawing.

A portable telephone 33 as the electronic device of the exemplary embodiment is configured including the active matrix substrate 21 shown in FIG. 7. By using the active matrix substrate 21 of FIG. 7, it is possible to obtain the portable telephone 33 which is low at cost and excellent in the light-resistance characteristic.

This will be described in more details. A casing 32 is provided to the portable telephone 33, and the liquid crystal display panel 31 is loaded to the casing 32 as a display unit. For the liquid crystal display panel 31, the active matrix substrate including one of the TFTs described in each exemplary embodiment is used.

With the exemplary embodiment, the light leak current of the TFTs contained in the liquid crystal display panel 31 is suppressed. Thus, it is possible to suppress destabilization of the operation of the liquid crystal display panel 31, even in a case of using a high-luminance backlight that enables the portable telephone 33 to be used under the natural light. This makes it possible for the users to enjoy the portable telephone 33 with a high display quality.

Needless to say, the present invention is not limited to each of the above-described exemplary embodiments. For example, the electronic device according to the present invention is not limited only to the portable telephone, but may be a personal computer, a PDA, a digital video, or the like.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A method for manufacturing a thin film transistor, the transistor including:
   a light-shielding film formed on an insulating substrate;
   an insulating film formed on the light-shielding film;
   a semiconductor film formed on the insulating film;
   a gate insulating film formed on the semiconductor film,
   wherein each layer of a laminate configured with a plurality of layers including the light-shielding film, the insulating film, and the semiconductor film is made of silicon or a material containing silicon, a sum of film thickness of the light-shielding film and the insulating film is equal to or less than a film thickness of the semiconductor film, a film thickness of the laminate is equal to or less than a film thickness of the gate insulating film, and the light-shielding film has light-shielding performance for wavelengths of 400 nm to 500 nm,
   the method for manufacturing the thin film transistor comprising:
   forming each layer of the laminate on the insulating substrate continuously in a same film-forming device; and then
   simultaneously patterning the each layer of the laminate.

2. The method for manufacturing the thin film transistor as claimed in claim 1, wherein the laminate has side faces that are in a bilateral symmetry in a sectional shape of a film-thickness direction.

3. The method for manufacturing the thin film transistor as claimed in claim 1, wherein the laminate has a side face that is patterned in a tapered form in such a manner that the sectional shape becomes smaller towards the upper side in the film-thickness direction.

4. The method for manufacturing the thin film transistor as claimed in claim 1, wherein the laminate has a side face that is patterned in a step form in such a manner that the sectional shape becomes smaller towards the upper side in the film-thickness direction.

5. The method for manufacturing the thin film transistor as claimed in claim 1, wherein the laminate has a side face that is patterned in a tapered form and in a step form in such a manner that the sectional shape becomes smaller towards the upper side in the film-thickness direction.

6. The method for manufacturing the thin film transistor as claimed in claim 1 wherein the light-shielding film has a film thickness with which an amount of transmitting light is reduced by half for a wavelength of about 450 nm.

7. The method for manufacturing the thin film transistor as claimed in claim 1, wherein the material containing silicon is a material having silicon as a main component.

8. The method for manufacturing the thin film transistor as claimed in claim 7, wherein the semiconductor film is made of polycrystalline silicon, and the light-shielding film is made of polycrystalline silicon having a film thickness of 50 nm or more.

9. The method for manufacturing the thin film transistor as claimed in claim 7, wherein the semiconductor film is made of polycrystalline silicon, and the light-shielding film is made of amorphous silicon having a film thickness of 10 nm to 20 nm.

* * * * *